United States Patent [19]

Kolm et al.

[11] 4,420,266
[45] Dec. 13, 1983

[54] PIEZOELECTRIC PRINTER AND PIEZOELECTRIC MULTILAM ACTUATOR USED THEREIN

[75] Inventors: Henry H. Kolm, Wayland; Eric A. Kolm, Brookline, both of Mass.

[73] Assignee: Piezo Electric Products, Inc., Cambridge, Mass.

[21] Appl. No.: 410,549

[22] Filed: Aug. 23, 1982

Related U.S. Application Data

[62] Division of Ser. No. 300,025, Sep. 8, 1981, Pat. No. 4,362,407.

[51] Int. Cl.$^3$ .............................................. B41J 3/12
[52] U.S. Cl. ................................... 400/124; 310/332; 101/93.05
[58] Field of Search ................... 400/124; 101/93.05; 310/328, 330-332, 312, 357-359, 365, 367

[56] References Cited

U.S. PATENT DOCUMENTS

| | | | |
|---|---|---|---|
| 2,809,520 | 10/1957 | Richard, Jr. | 73/189 |
| 3,247,404 | 4/1966 | Batsch | 310/331 |
| 3,487,239 | 12/1969 | Schafft | 310/328 |
| 3,500,451 | 3/1970 | Yando | 310/331 |
| 3,949,247 | 4/1976 | Fenner et al. | 310/332 |
| 4,174,182 | 11/1979 | Lendl | 310/328 X |
| 4,176,976 | 12/1979 | Lendl | 310/328 X |
| 4,193,703 | 3/1980 | Sakmann | 400/124 |
| 4,237,399 | 12/1980 | Sakamoto | 310/332 |
| 4,245,172 | 1/1981 | Shirley | 310/332 |
| 4,362,407 | 12/1982 | Kolm et al. | 400/124 |

FOREIGN PATENT DOCUMENTS

| | | | |
|---|---|---|---|
| 254343 | 9/1964 | Australia | 310/332 |
| 1322876 | 7/1973 | United Kingdom | 101/93.05 |
| 2066563 | 7/1981 | United Kingdom | 310/332 |

OTHER PUBLICATIONS

"Piezoceramic Deflector" Fleischer, vol. 13 No. 6 Nov. 1970, IBM Technical Disclosure Bulletin.

*Primary Examiner*—E. H. Eickholt
*Attorney, Agent, or Firm*—Joseph S. Iandiorio

[57] ABSTRACT

A piezoelectric printer including: a frame; a plurality of printer units mounted on the frame; each unit including a piezoelectric multilam including at least two piezoelectric members and having a mounting portion and an actuating portion; the actuating portion moveable in an actuating direction and a cocking direction, the multilam being tapered in its lateral dimension and being larger at the mounting portion and smaller at the actuating portion; a weight carried by the multilam for increasing the energy transfer of the multilam; and a printing element driven by the actuating portion; means for applying a cocking voltage and an actuating voltage to the members, which voltages are less than the rupture voltage in the poling direction and less than the depoling voltage in the depoling direction, for cocking and actuating the multilam to drive the printing element to the printing position and guide means attached to the frame for guiding the printing elements; the printer units are arranged in sets of stacked arrays, which may be overlapped and may include holes in each of the inferior printer units for receiving printer elements from superior printing units.

7 Claims, 10 Drawing Figures

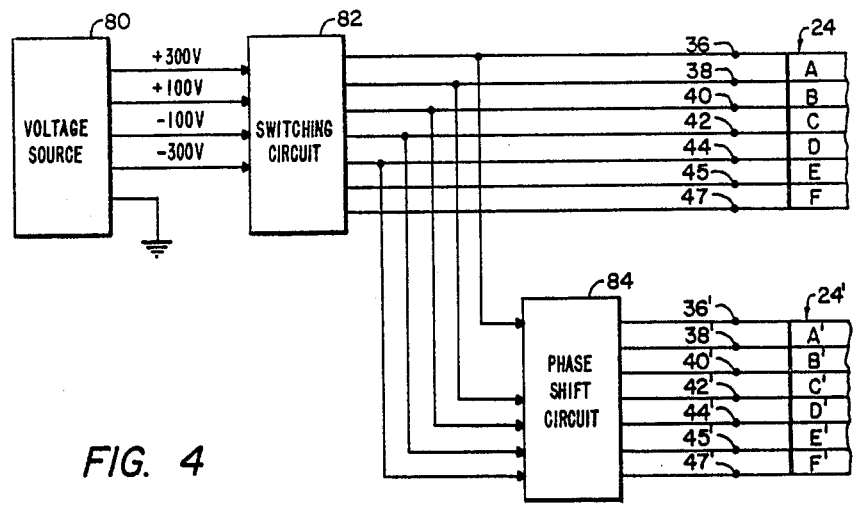
FIG. 4
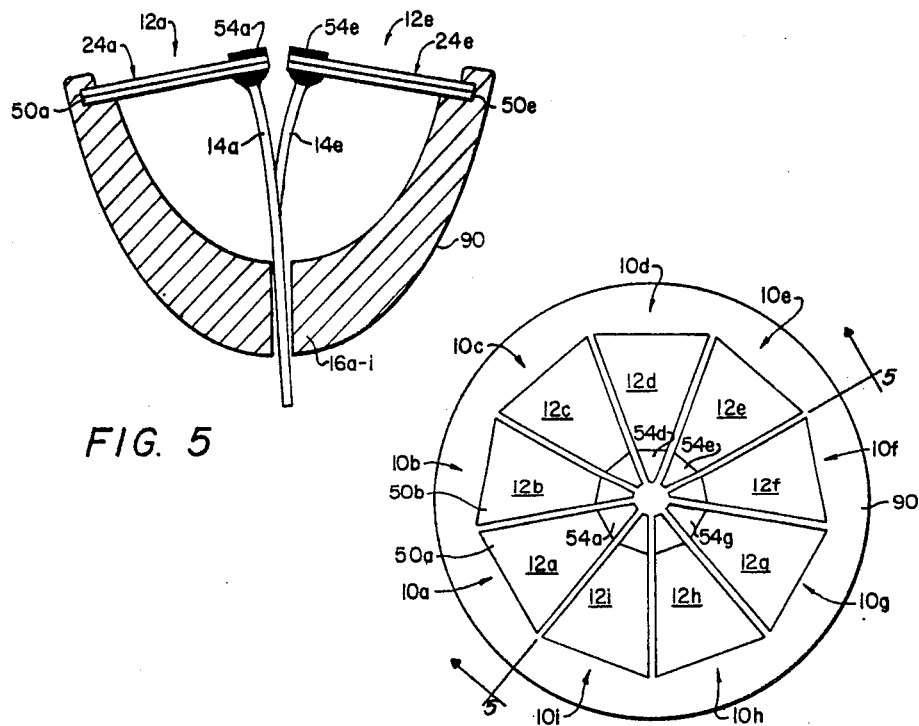
FIG. 5
FIG. 6

PIEZOELECTRIC PRINTER AND PIEZOELECTRIC MULTILAM ACTUATOR USED THEREIN

This application is a division of application Ser. No. 300,025, filed Sept. 8, 1981 now U.S. Pat. No. 4,362,407.

FIELD OF INVENTION

This invention relates to a piezoelectric printer, and to a piezoelectric actuator which combined with a printing element provides a printer unit for constructing a dot matrix printer.

BACKGROUND OF INVENTION

Dot matrix printers use a printing head which includes a vertical row of seven to eleven fine wires guided by holes drilled in a block and driven selectively to strike a film or cloth ribbon as the printing head moves across a piece of paper. Individual characters are formed by selectively printing a matrix of dots using the fine wires or printing elements. The matrix is typically from seven dots wide by seven dots high, up to seven dots wide by eleven dots high. The more dots used, the better will be the quality of the characters that are printed. This type of printer is in common use to produce printouts of computers and word processors where the speed of conventional type printers is inadequate. This type of printer is substantially faster than type printers, but not so fast as line printers which can print entire lines of type simultaneously.

Conventional dot matrix printers may be operated magnetically using a magnetic relay in which a coil or solenoid moves an armature that drives one of the printing wires or elements. One such relay is required for each of the seven to eleven wires; the relays may be arranged in a circle around the block which guides the wires to the print wires. The relay devices are made as small as possible to permit operation at high speed, and also to minimize obstruction of the operator's view of the paper being printed. However, such magnetic drivers are not very energy efficient because of the resistance heating in the coils, and the efficiency decreases as the coils are made smaller. Thus the heating problem limits the speed of operation of the driver relays or solenoids of the matrix printers, although they do reach a speed of over 200 characters per second.

Another form of magnetically operated dot matrix printer uses a spring to drive each printer wire or element toward the paper. Each printer wire is retained in a cocked position by a permanent magnet acting against an iron head attached to each of the print wires. The print wire is released by the energization of a solenoid which provides an opposing field to that of the retaining permanent magnet. Energy is stored in the spring by the permanent magnet prior to the prining release. These types of stored-energy printers tend to be more expensive and are still not significantly faster than the armature-driven printers. Piezoelectric devices are inherently more energy efficient and involve less moving mass than magnetic devices, but attempts to design a piezoelectric printing head have not been too successful. Piezoelectric materials expand in an electric field if one polarity is applied to them and contract when that polarity is reversed. They produce very high forces but very small displacements. To increase the displacement, one approach is to stack small piezoelectric disks, each energized by its own voltage source, electrically in parallel but mechanically in series, known as stack motors. These motors do generate enough displacement to drive a print wire with sufficient energy to make a dot impression, but their mass is too large to operate any faster than the equivalent magnetic armatures, and their cost can be must higher. Bilams are a common piezoelectric component made of two piezoelectric members laminated together, but they typically require large volume to generate the necessary energy for impact printing and this in turn requires high drive voltage, which is hazardous and is difficult to provide.

Speed, small size and compactness are sought in all of these designs with the purpose that if sufficient speed could be attained, two or more impacts could be made for each character, thus making it possible to compact the printer elements and to overlap individual dots in a staggered matrix array so that continuous lines rather than dotted lines could be used to print the characters and thereby improve the print quality. Or alternatively, the speed could be increased while the quality remains unchanged.

SUMMARY OF INVENTION

It is therefore an object of this invention to provide an improved highly compact, energy efficient, high speed piezoelectric printer.

It is a further object of this invention to provide such a printer which is inexpensive and operates on low voltage.

It is a further object of this invention to provide such a printer which can tightly compact the actuator units for enabling close overlapping, or staggered arrangements of the printing elements.

It is a further object of this invention to provide such a printer which can provide increased quality dot matrix printing.

It is a further object of this invention to provide an improved small, energy-efficient, high-speed piezoelectric actuator.

It is a further object of this invention to provide such an actuator which develops sufficient force and displacement to drive effectively a printer wire or element.

It is a further object of this invention to provide such an actuator which provides uniform response and increased energy transfer.

It is a further object of this invention to provide such an actuator which uses a piezoelectric multilam.

It is a further object of this invention to provide such an actuator which may be electrically cocked and then fired or actuated.

It is a further object of this invention to provide such an actuator which can be combined with a printer element to form a printer unit that can be used in groups to make a dot matrix printer.

The invention results from the realization that a truly efficient, small, high-speed printer can be effected using a piezoelectric multilam and that multilam operation is enhanced by a tapered shape, which improves uniformity of stress distribution, a proper weighting, which increases energy transfer, and an electrical cocking preliminary to actuation, which increases energy output.

This invention features a piezoelectric printer including a frame and a plurality of printer units mounted on the frame. Each unit includes a piezoelectric multilam including at least two piezlelectric members and having a mounting portion and and an actuating portion. The actuating portion is moveable in an actuating direction and a cocking direction. The multilam is tapered in its lateral dimension so that it is larger at the mounting portion and smaller at the actuating portion. There is a weight carried by the multilam for increasing the energy transfer of the multilam. Each printer unit also includes a printing element driven by the actuating portion. There are means for applying a cocking voltage and an actuating voltage to the members, which voltage is less than the rupture voltage in the poling direction and less than the depoling voltage in the depoling direction, for cocking and actuating the multilam to drive the printing element to the printing means. Guide means attached to the frame guide the movement of the printing elements.

In a preferred embodiment, the printer units in a printer are arranged in sets of stacked arrays, each set including at least two printer units. The printer units may be staggered or overlapped, longitudinally or laterally, and in some cases inferior printer units may include one or more holes for receiving the printer elements of one or more superior printer elements. The means for applying may include a phased voltage supply for driving the units in phased relationship with each other, and the piezoelectric multilam members may be all formed from a single piezoelectric component.

The invention also features a piezoelectric printer unit used in such a printer and including a piezoelectric multilam including at least two piezoelectric members and having a mounting portion and an actuating portion. The actuating portion is moveable in an actuating direction and a cocking direction. The multilam is tapered in its lateral dimension so as to be larger at the mounting portion and smaller at the actuating portion. There is a weight carried by the multilam for increasing the energy transfer of the multilam. A printer element is driven by the actuating portion, and there are means for applying a cocking voltage and an actuating voltage to the members, which voltages are less than the rupture voltage in the poling direction and less than the depoling voltage in the depoling direction, for cocking and actuating the multilam to drive the printing element in the printing direction to the printing position.

The invention also features the basic piezoelectric actuator which forms the printer unit. The actuator includes a piezoelectric multilam including at least two piezoelectric members having a mounting portion and an actuating portion. The actuating portion is moveable in an actuating direction and a cocking direction. The multilam is tapered in its lateral dimension to be larger at the mounting portion and smaller at the actuating portion. A weight carried by the multilam increases the energy transfer of the multilam. There are means for applying a cocking voltage and an actuating voltage to the members, which voltages are less than the rupture voltage in the poling direction and less than the depoling voltage in the depoling direction, for cocking and actuating the multilam. The multilam may be generally trapezoidal in shape, and the weight may be concentrated at the actuator portion. The duration of the cocking voltage is typically approximately equal to the period of the resonant frequency of the multilam.

DISCLOSURE OF PREFERRED EMBODIMENT

Other objects, features and advantages will occur from the following description of a preferred embodiment and the accompanying drawings, in which:

FIG. 4 is a means for generating and applying the voltage wave forms of FIG. 3;

FIG. 5 is a schematic side elevational view of a printer taken along line 5-5 of FIG. 6;

FIG. 6 is a top plan view of the printer of FIG. 5;

The printer of this invention may be accomplished using a frame and a plurality of printer units mounted on the frame. Each of the units includes a piezoelectric multilam including at least two piezoelectric members and having a mounting portion and an actuating portion. The actuating portion is moveable in an actuating direction and a cocking direction. The multilam is tapered in its lateral dimension to be larger at the mounting portion and smaller at the actuating portion. The taper may actually be trapezoidal in shape. There is a weight carried by the multilam for increasing its energy transfer, and the weight may be concentrated at the actuating portion. There are means for applying a cocking voltage and an actuating voltage to the members, which voltages are less than the rupture voltage in the poling direction and less than the depoling voltage in the depoling direction, for cocking and actuating the bilam to drive the printing element. The depoling voltage of course should never exceed a voltage which would instantaneously depole the poiezoelectric material, and should be low enough to provide a life span for the material which is commensurate with its application. In most cases, the longest possible life is desired and the depoling voltage will be zero or very close to it. The printer is also provided with guide means attached to the frame for guiding the movement of the printing elements.

The printer units are arranged in sets of stacked arrays, with each set including at least two units. In one construction, the units are staggered or disposed in an overlapping relationship, either longitudinally or laterally, in order to further increase the density of the printing elements and of the dot matrix produced. This is possible because the construction of the piezoelectric printer units and the underlying piezoelectric actuator is such that high-speed, high-energy printing can be effected by a very compact arrangement of the printer units without excessive heating problems. Inferior printer units may include one or more holes for receiving the printer elements of one or more superior printer units.

Figure 1:
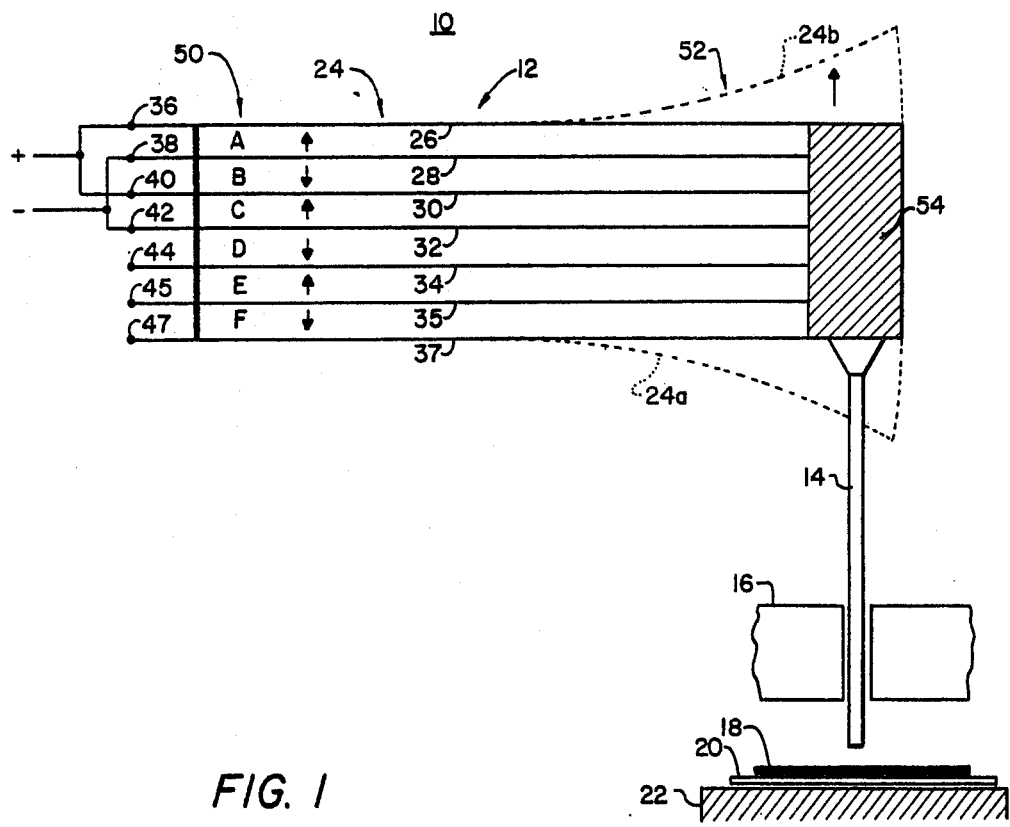
FIG. 1 is a schematic side elevational view of a printer unit using the piezoelectric actuator according to this invention.

There is shown in FIG. 1 piezoelectric printer unit 10 according to this invention which includes piezoelectric actuator 12, printing element or wire 14, and guide block 16 which guides printing element or wire 14 as its moves to enable it to strike ribbon 18 at the proper location over paper 20 aligned against platen 22. Piezoelectric actuator 12 includes a piezoelectric multilam 24 having six piezoelectric members or layers A, B, C, D, E and F sandwiched between metal sections 26, 28, 30, 32, 34, 35 and 37 in the conventional bilam construction. A multilam as used herein is a piezoelectric device constructed as a bilam and having at least two layers. Piezoelectric bilams are also known as benders or bimorphs and are more fully explained in Glenite Piezoceramics, by Gulton Industries, Inc. Piezoelectric layers A-F may be made of piezoelectric materials such as barium titanate or lead titanate-lead zirconate. Sections 26, 28, 30, 32, 34, 35, and 37 may be made of metals such as brass, stainless steel, bronze, etc., and in simple applications may also function as electrodes 36, 38, 40,42, 44, 45 and 47, i.e. means to apply voltage directly across layers A, B, C, D, E and F. Mounting portion 50 of multilam 24 is the part that is fixed to the frame portions of the printer unit, while actuating portion 52 is free to move to drive printing element or wire 14.

A weight is added to multilam 24 to increase its ability to transfer energy during the actuating stroke. The weight is empirically determined by adding weight to multilam 24 until the maximum energy transfer is observed. That weight is applied distributively over the entire multilam, or at least the actuating portion 52 of it, or it may be concentrated as depicted by weight 54 at the end of the actuating portion. In that instance, print wire 14 may be directly attached to weight 54. Alternatively, print wire 14 may be attached directly to multilam 24 or may be separate and independent of multilam 24. Wire 14 may be any typical wire or element used in conventional dot matrix printers. The addition of weight 54 in whatever form increases the kinetic energy transfer during the actuating motion of multilam 24. Multilam 24 may be 0.067 inches thick.

Figure 2:
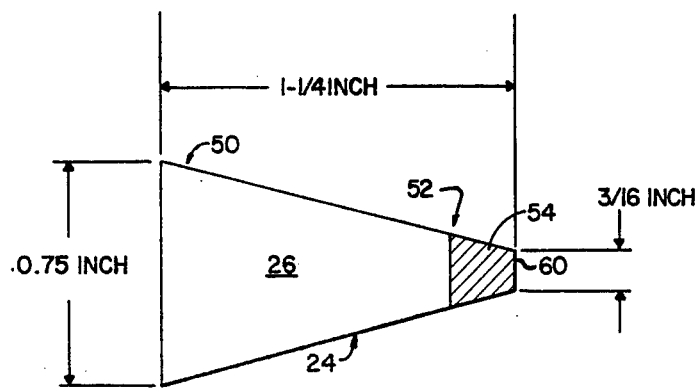
FIG. 2 is a diagrammatic plan view of the actuator of FIG. 1.

Multilam 24 may have a tapered shape in its lateral dimension such as shown in FIG. 2, where the trapezoidal shape is ¾ inch in the lateral dimension at the fixed end or mounting portion 50, and approximately 3/16 inch at the tip 60. Multilam 24 is approximately 1¼ inches long. This tapered shape improves the uniformity of stress distribution of multilam 24 and thereby causes all sections of multilam 24 to store and release energy uniformly in the piezoelectric material. Thus in the cantilevered configuration of FIG. 1, the broadest lateral portion is at the fixed end or mounting portion 50, where maximum bending stress will occur, while the narrowest lateral dimension is at tip 60, where the least amount of bending stress will occur. In such a device, over 90% of the energy is recovered and over 1000 dots per second may be printed.

A piezoelectric multilam or bending element is capable of generating a certain amount of mechanical energy per unit volume when it is subjected to a given electric field, measured in volts per millimeter. If the bender were made of only two layers, one to contract and the other to expand, the voltage required to cause maximum deflection and energy generation might be as high as 3,000 volts, which is excessive in terms of circuitry and safety. It is therefore desirable in order to permit operation at reasonable voltages, to divide the bending element into more than two layers, e.g. six layers, as shown in FIG. 1. By connecting layers in parallel, it is then possible to operate at only one third of the voltage required by a two-layer element of the same total thickness.

In a simple application, multilam 24 is driven from its neutral position, as shown in full lines in FIG. 1, to its actuated position as shown in dashed lines 24a and to its cocking position as shown in dashed lines 24b, by the application of the proper voltages to layers A-F by means of electrodes 36-47. The manner in which the six-layer multilam 24 in FIG. 1 is energized is as follows. Arrows on each layer A-F indicate the direction of poling. A voltage applied in the direction of poling, arrowhead positive, causes that layer to contract in its longitudinal direction. In order to cause multilam 24 to bend upward to position 24b, the upper three layers A, B, C are made to contract by applying a voltage to them in their poling directions, which is accomplished by the connections shown. Voltage applied in the poling direction may be as high as is permitted by the limit of mechanical rupture. To assist the upward bending motion, the lower three layers can be energized in their respective depoling directions (arrowheads negative), but this causes depoling and therefore the reverse voltage must be kept below a certain limit, which will depend on the desired lifetime of the piezoelectric element. The reverse voltage can be kept at zero if the maximum service life is desired. "Depoling voltage" as used herein refers to the reverse voltage, including zero, which is applied to the elements. A trade-off exists between the amount of energy available from a given volume of multilam, and the desired lifetime before the multilam is gradually depoled.

To cause multilam 24 in FIG. 1 to bend downward to position 24a, voltage is applied to the bottom three layers D, E, F, in their respective poling directions (arrowheads positive), which causes the three bottom layers to contract in their longitudinal directions. During this downward excitation, the upper three layers A-C are subject to the depoling voltage.

Figure 3:
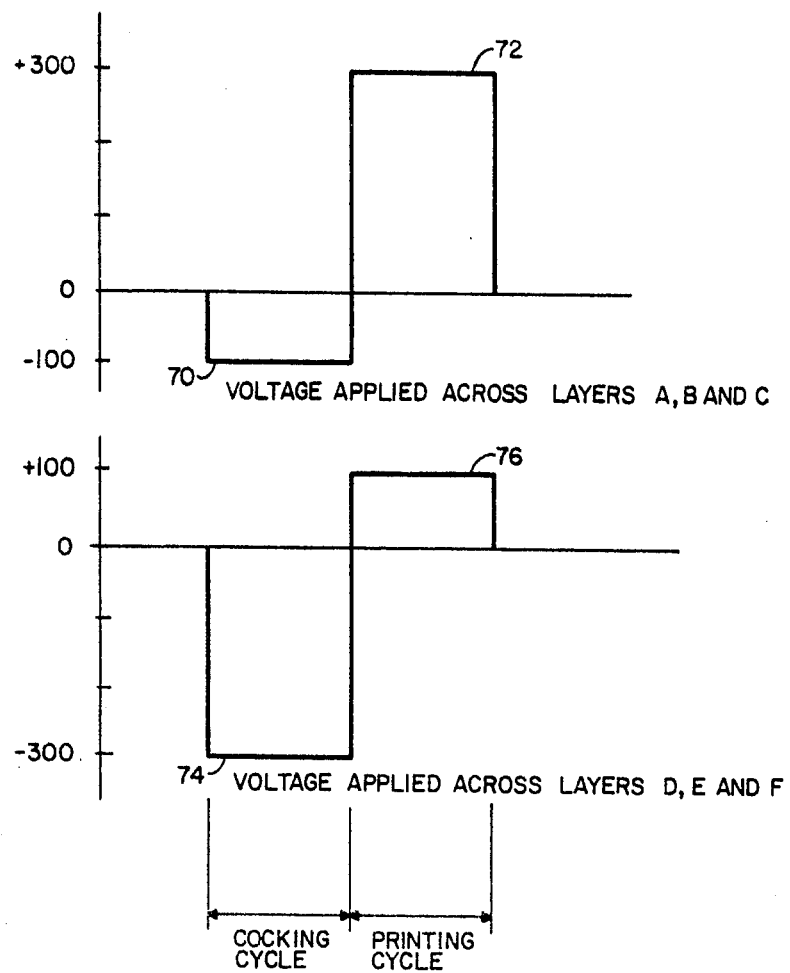
FIG. 3 illustrates the voltage wave forms applied during the cocking cycle and printing cycle to the actuator of FIG. 1.

Thus as shown in FIG. 3, only −100 volts, 70, may be applied across layers A, B and C in the depoling direction during the cocking cycle, but there may be 300 volts, 72, applied across them in the poling direction during the printing cycle.

Similarly, layers D, E and F may have −300 volts 74, applied to them in the poling direction during the cocking cycle, but only 100 volts, 76, applied across them in the depoling direction during the printing cycle. This voltage may be higher if shorter multilam life is acceptable, and may be decreased as far as zero depending on the increase in life desired. The period of the cocking cycle is typically chosen to be that of the resonant frequency of the multilam (including any additional parts, e.g. weight, printer wire). For example, the resonant frequency of the device of FIGS. 1 and 2 is 500 Hz and the cocking period is 0.5 millisecond. Ordinarily, one would expect the cocking and actuating periods to be one half the period of the resonant frequency for optimum energy transfer. However for some reason, as yet undetermined, the maximum energy transfer occurs when the periods are essentially the same. The duration that the printing element remains in the printing position, or dwell, may be increased by increasing the period of the actuating voltage in excess of the period of resonance. The voltages are applied to metal shims, or if plastic films are used, then voltages are applied to conducting layers on the ceramic surfaces in the form of vacuum sputtered metal films, electroplated metal layers, conducting cements, or diffused metal layers on the ceramic surfaces (fired glaze layers containing metal).

The means for applying voltage pulses shown in FIG. 3 may include a voltage source 80, FIG. 4, which supplies + and −300 volts, and + and −100 volts, to a switching circuit 82 which sequentially first applies −100 volts and −300 volts to layers A, B and C and layers D, E and F, respectively, and then supplies +300 volts and +100 volts to layers A, B and C and layers B, D and F, respectively.

Faster operation can be produced by driving a set of multilams in phased relationship. For example, the output of switching circuit 82 may be submitted to phase shift circuit 84, which provides a 180 degree phase shift of the voltage supplied to electrodes 36'-47', as compared with the voltage supplied directly to electrodes 36-47. Multilams 24 and 24' are therefore driven 180 degrees out of phase so that one is firing while the other one is cocking.

One or more printer units 10 may be utilized in a printer for driving a multiple of printing wires. For example, as shown in FIGS. 5 and 6 nine printing units 10a-10i are mounted on frame 90, which integrally includes guide blocks 16a-i for receiving wires 14a-i, that are aligned in a straight line by integral guide blocks 16a-i which receive wires 14a-i.

Figure 7:
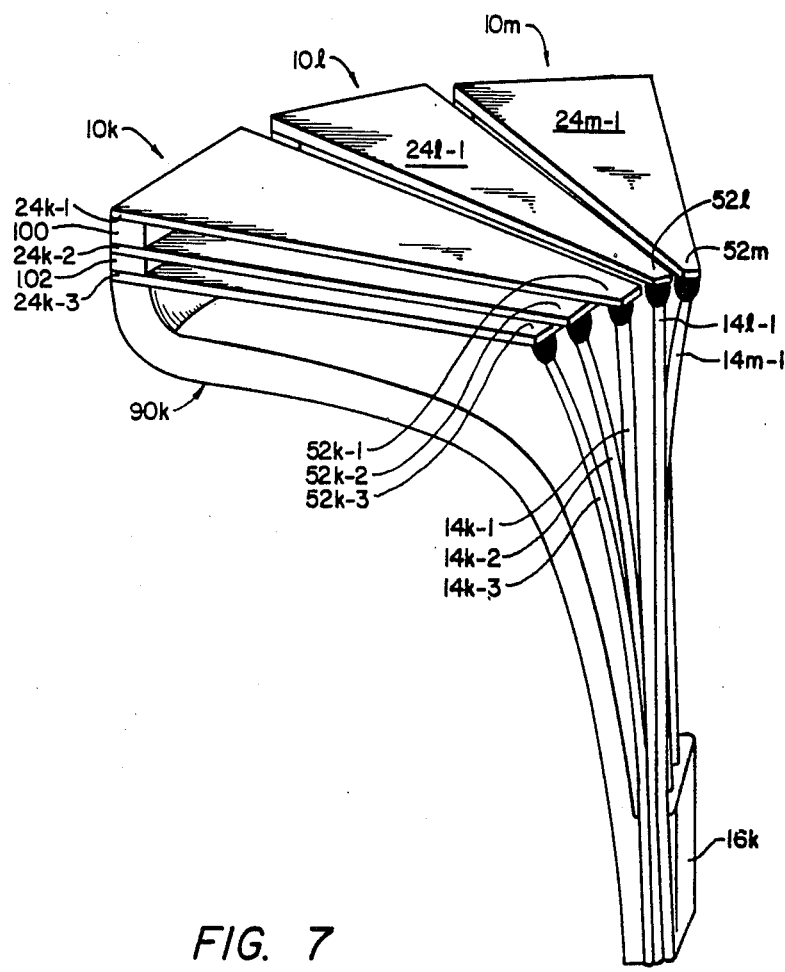
FIG. 7 is an axonometric view of a portion of a printer according to this invention including a plurality of printer units stacked one on top of the other with their actuator portions overlapping.
Figure 8:
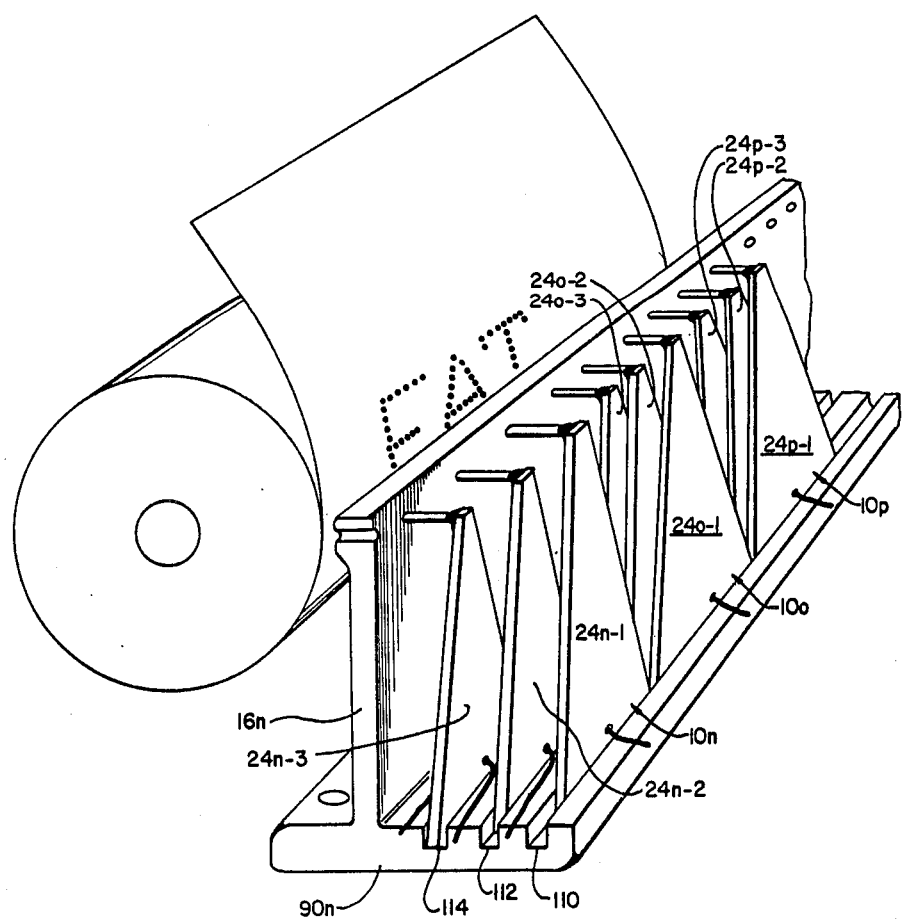
FIG. 8 is an axonometric view of a portion of a printer according to this invention having a plurality of sets of printer units in which the printer units in each set are overlapped laterally with respect to each other.

The printer units need not be used singly, but may be used in groups or sets of two or more as shown in FIG. 7, where there is shown a portion of a circular printer including a frame 90k that carries a number of printer units, only three shown, 10k, 10l, 10m, each of which includes a plurality of multilams such as 24k-1, 24k-2, 24k-3, in a stacked array spaced by blocks 100, 102. Multilam 24k may be arranged in an overlapping fashion so that the actuating portion 52k-1 overlaps actuating portion 52k-2, which in turn overlaps the actuating portion 52k-3, so that their respective printing elements or wires 14k-1, 14k-2, 14k-3 do not interfere with each other as they move in the holes in guide block 16k, which also acts to engage the wire elements 14l and 14m. Only one of each, 14l-1, 14m-1, is shown for clarity. Units 10l and 10m are formed in a similar way. The multilams in a printer unit may also be staggered laterally, for example as shown in FIG. 8, where frame 90n includes slots 110, 112, and 114 for holding one each of the multilams 24n-1, 24n-2 and 24n-3 of printer unit 10n, which multilams are staggered laterally so that multilam 24n-2 overlaps to the right of multilam 24n-3, and 24n-1 overlaps to the right of multilam 24n-2. Similar construction adheres with respect to printer unit 10o with respect to its multilam units 24o-o1, 24o-2, and 24o-3, as well as multilams 24p-1, 24p-2, and 24p-3 of printer unit 10p.

Figure 9:
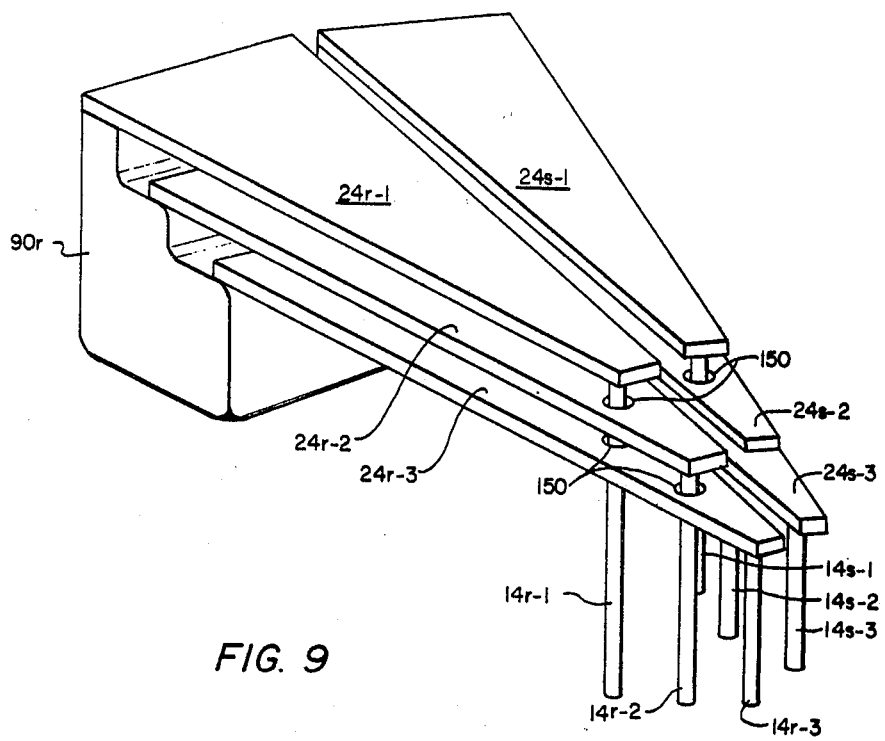
FIG. 9 is an axonometric view of a portion of a printer according to this invention having a plurality of sets of printer units in which the printer units in each set are overlapped and the inferior multilams have holes for receiving the printer elements of the superior multilams.

In FIG. 9 there is illustrated an embodiment in which each inferior multilam 24r-3, 24s-3, 24r-2, 24s-2, has one or more holes 150 to accommodate passage of elements 14r-1, 14r-2, 14s-1, 14s-2 of each superior multilam 24r-1, 24r-2, 24s-1, 24s-2, respectively. Each of the multilams has its mounting portion attached to frame 90k.

The configurations shown in FIGS. 7-9 are illustrative only and are for the purpose of showing some convenient and compact ways that the printer of this invention can be made to facilitate high-density, high-quality, high-speed printing.

Figure 10:
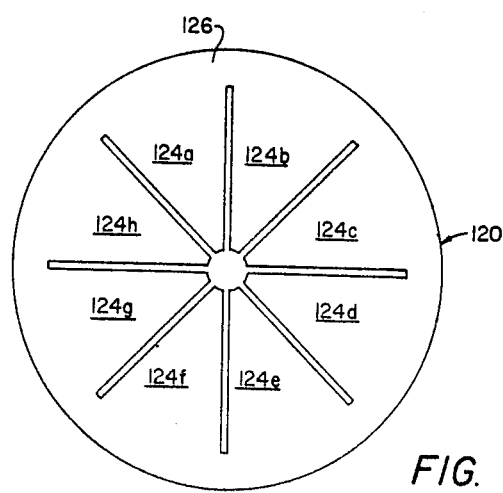
FIG. 10 is a plan view of a number of multilams formed in a single piezoelectric component.

Although thus far the multilams are shown as individually formed elements, this is not a necessary limitation of the invention, for they may be formed as integral units, for example as shown in FIG. 10, where a single piezoelectric component 120 is divided into eight multilams 124a, 124b, 124c, 124d, 124e, 124f, 124g, and 124h, which are all segments of the same plate and are connected at the outer annular periphery 126.

Other embodiments will occur to those skilled in the art and are within the following claims:

What is claimed is:
1. A piezoelectric actuator comprising:
a piezoelectric multilam including at least two piezoelectric members and having a mounting portion and an actuating portion; said actuating portion being movable in an actuating direction and a cocking direction; said multilam being tapered in its lateral dimension, being larger at the mounting portion and smaller at the actuating portion;
a weight carried by said multilam for increasing the energy transfer of said multilam;
means for applying a cocking voltage and an actuating voltage to said members which voltages are less than the rupture voltage in the poling direction and less than the depoling voltage in the depoling direction for cocking and actuating said multilam, the duration of said cocking voltge being approximately the period of the resonant frequency of said multilam.

2. The piezoelectric actuator of claim 1 in which said multilam is generally trapezoidal in shape.

3. The piezoelectric actuator of claim 1 in which said weight in concentrated at said actuator portion.

4. The piezoelectric actuator of claim 1 further including means for applying a voltage to said multilam.

5. The piezoelectric actuator of claim 4 in which said means for applying a voltage includes electrodes attached to said multilam.

6. The piezoelectric actuator of claim 1 in which said multilam includes more than two piezoelectric members.

7. A piezoelectric actuator comprising:
a piezoelectric multilam including at least two piezoelectric members and having a mounting portion and an actuating portion; said actuating portion being movable in an actuating direction and a cocking direction; said multilam being tapered in its lateral dimension, being larger at the mounting portion and smaller at the actuating portion;
a weight carried by said multilam for increasing the energy transfer of said multilam;
means for applying a cocking voltage and an actuating voltage to said members which voltages are less than the rupture voltage in the poling direction and less than the depoling voltage in the depoling direction for cocking and actuating said multilam, the duration of said cocking voltge being greater than the period of the resonant frequency of said multilam.

* * * * *